(12) United States Patent
Komoto

(10) Patent No.: US 10,797,418 B2
(45) Date of Patent: Oct. 6, 2020

(54) CONNECTOR, CIRCUIT BOARD ASSEMBLY AND CONNECTION STRUCTURE

(71) Applicant: Japan Aviation Electronics Industry, Limited, Tokyo (JP)

(72) Inventor: Tetsuya Komoto, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 16/675,812

(22) Filed: Nov. 6, 2019

(65) Prior Publication Data

US 2020/0235504 A1    Jul. 23, 2020

(30) Foreign Application Priority Data

Jan. 21, 2019   (JP) .................... 2019-007695

(51) Int. Cl.
| | |
|---|---|
| *H01R 13/627* | (2006.01) |
| *H01R 12/71* | (2011.01) |
| *H05K 3/36* | (2006.01) |
| *H01R 12/78* | (2011.01) |

(52) U.S. Cl.
CPC ....... *H01R 12/716* (2013.01); *H01R 13/6273* (2013.01); *H01R 12/78* (2013.01); *H05K 3/361* (2013.01)

(58) Field of Classification Search
CPC ............... H01R 12/78; H01R 13/5804; H01R 13/5812; H01R 4/5083; H01R 13/62; H01R 12/774; H01R 12/61; H01R 12/613; H01R 13/20; H01R 12/777; H01R 12/79; H05K 3/361; H05K 3/365
See application file for complete search history.

(56) References Cited

U.S. PATENT DOCUMENTS

| | | | | |
|---|---|---|---|---|
| 4,647,125 A | * | 3/1987 | Landi ................... | H01R 12/61 29/873 |
| 2014/0017953 A1 | | 1/2014 | Iwano et al. | |
| 2015/0079817 A1 | * | 3/2015 | Hashiguchi ......... | H01R 43/205 439/75 |

(Continued)

FOREIGN PATENT DOCUMENTS

| | | |
|---|---|---|
| FR | 2488739 A1 | 2/1982 |
| JP | 05-075248 A | 3/1993 |

(Continued)

*Primary Examiner* — Tho D Ta
(74) *Attorney, Agent, or Firm* — Muncy, Geissler, Olds & Lowe, P.C.

(57) ABSTRACT

A connector includes a first connector portion having projection units and at least one locking portion situated between at least one pair of adjacent projection units, and a second connector portion having fitting hole units and at least one portion to be locked, each projection unit of the first connector portion being fitted into each fitting hole unit of the second connector portion as catching a first contact portion of a first circuit board and a second contact portion of a second circuit board that face to be overlapped on each other, the first contact portion and the second contact portion being electrically connected to each other between a lateral surface of each projection unit and an inner surface of each fitting hole unit, while each locking portion is caught on a corresponding portion to be locked.

14 Claims, 11 Drawing Sheets

(56) References Cited

U.S. PATENT DOCUMENTS

| | | | |
|---|---|---|---|
| 2016/0181715 A1* | 6/2016 | Schrader | H01R 13/5812 |
| | | | 439/67 |
| 2019/0027842 A1* | 1/2019 | Hashiguchi | H02G 1/14 |
| 2019/0027846 A1* | 1/2019 | Hashiguchi | H05K 3/365 |
| 2019/0157782 A1* | 5/2019 | Hashiguchi | H01R 12/73 |

FOREIGN PATENT DOCUMENTS

| | | |
|---|---|---|
| JP | H10106695 A | 4/1998 |
| WO | WO-2012011193 A1 | 1/2012 |

* cited by examiner

FIG. 2
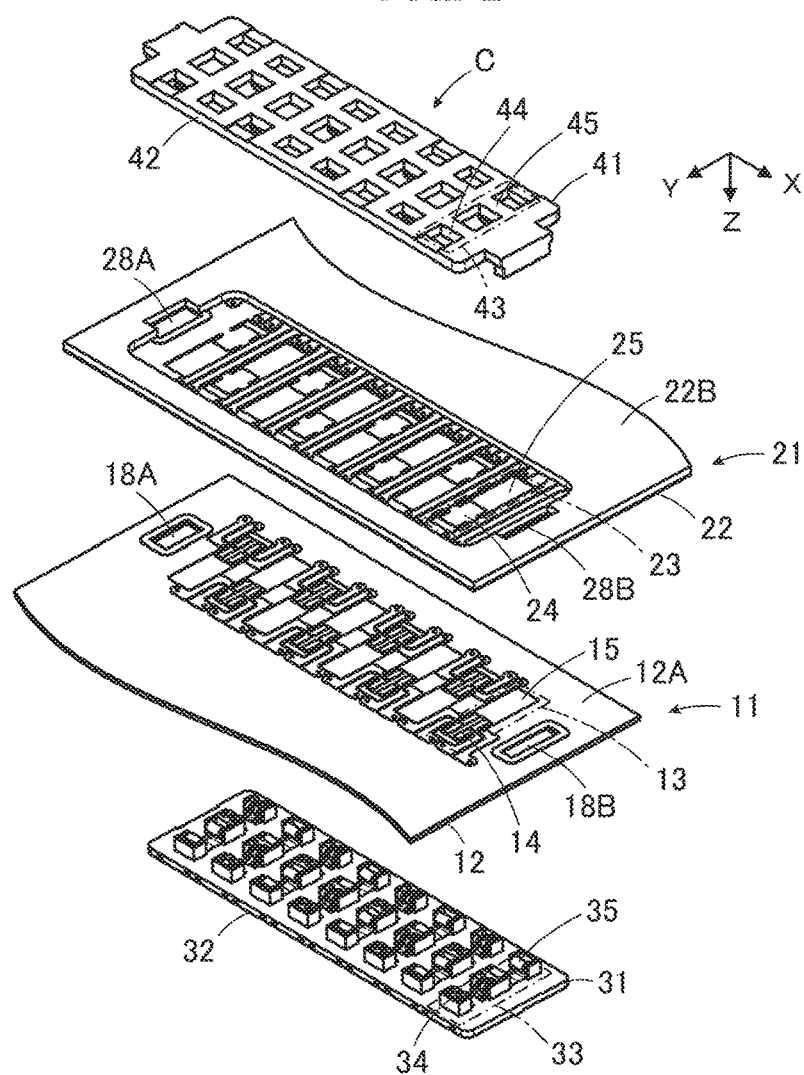
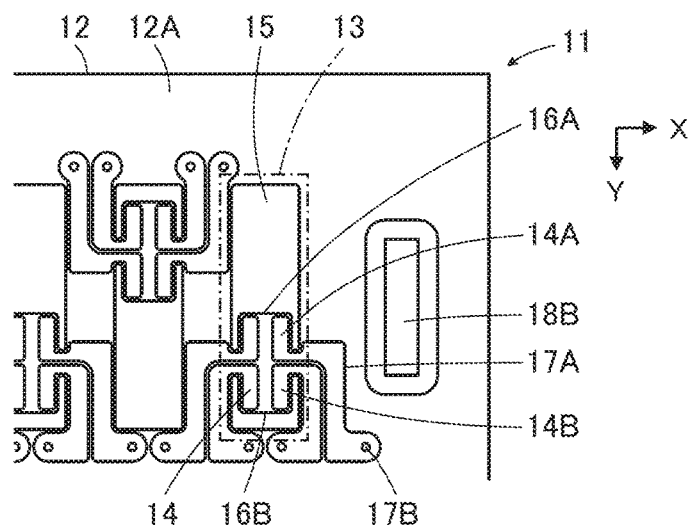
FIG. 3

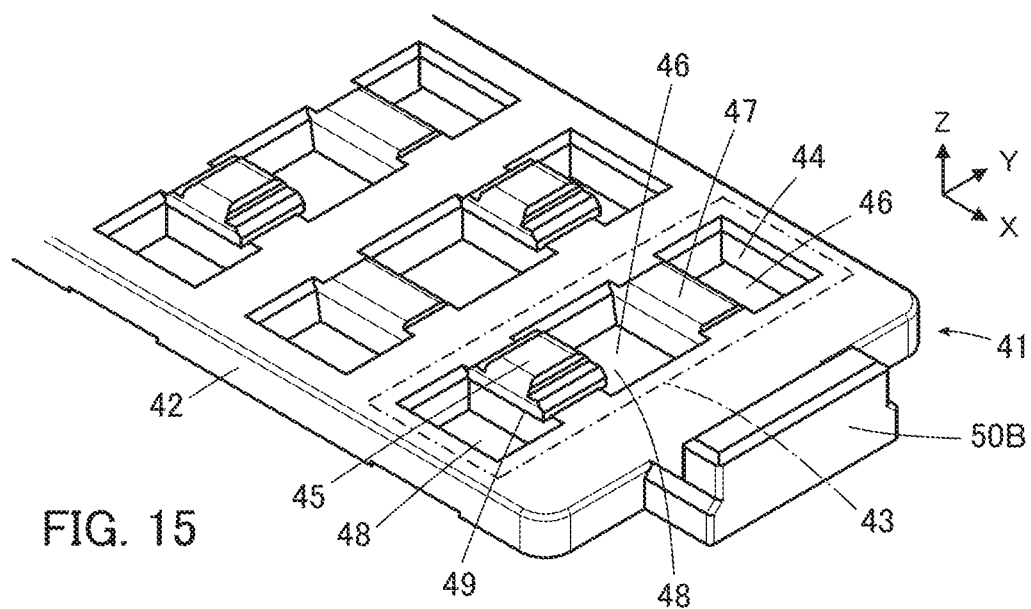
FIG. 15
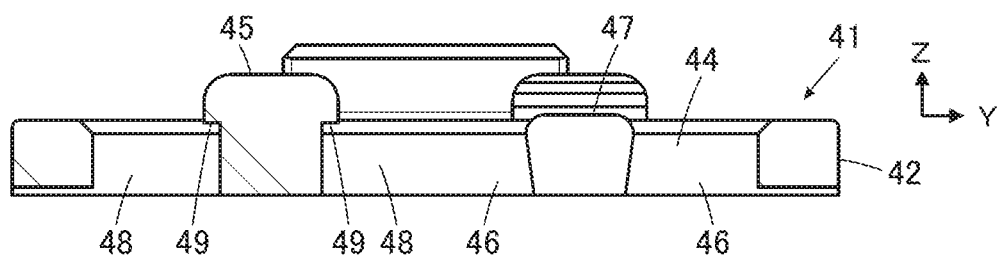
FIG. 16
FIG. 17
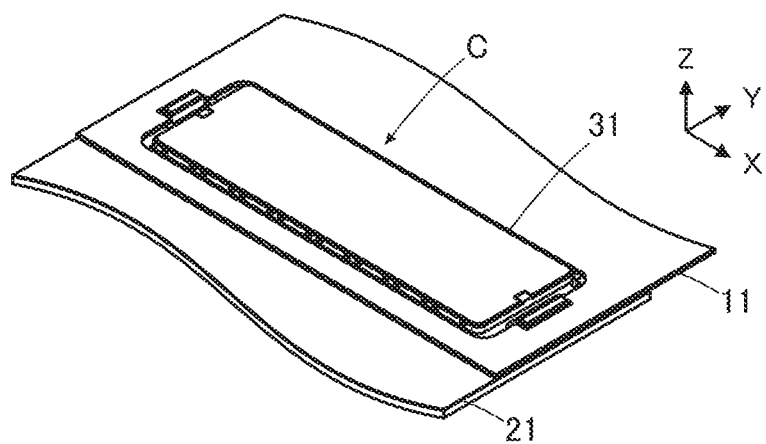

CONNECTOR, CIRCUIT BOARD ASSEMBLY AND CONNECTION STRUCTURE

BACKGROUND OF THE INVENTION

The present invention relates to a connector, particularly to a connector for connecting a first circuit board having a bendable first contact portion and a second circuit board having a bendable second contact portion.

The present invention also relates to a circuit board assembly in which the first circuit board and the second circuit board are connected by means of the connector.

The present invention also relates to a connection structure for connecting the first contact portion of the first circuit board and the second contact portion of the second circuit board.

A connector for connecting flexible flat cables to each other is disclosed by, for example, JPH 05-75248 A. This connector is used to connect circuit conductors 1A of one flat cable 1 and circuit conductors 2A of the other flat cable 2 as shown in FIG. 27, and includes a resin case 3, a resin cover 4 and a flat cable small piece 5. With an end of the flat cable 1 and an end of the flat cable 2 being inserted in a substantially-cuboid fitting recess 6 of the resin case 3, a substantially-cuboid pressure fitting section 7 projecting from the resin cover 4 is, together with the flat cable small piece 5, fitted into the fitting recess 6 of the resin case 3.

Consequently, the circuit conductors 1A of the flat cable 1 and circuit conductors 5A of the flat cable small piece 5 are sandwiched by the inner surface of the fitting recess 6 of the resin case 3 and the outer surface of the pressure fitting section 7 of the resin cover 4 and brought into contact with each other, while the circuit conductors 2A of the flat cable 2 and the circuit conductors 5A of the flat cable small piece 5 are sandwiched by the inner surface of the fitting recess 6 of the resin case 3 and the outer surface of the pressure fitting section 7 of the resin cover 4 and brought into contact with each other. As a result, the circuit conductors 1A of the flat cable 1 and the circuit conductors 2A of the flat cable 2 are electrically connected to each other via the circuit conductors 5A of the flat cable small piece 5.

Since, however, the substantially-cuboid pressure fitting section 7 projecting from the resin cover 4 is fitted into the substantially-cuboid fitting recess 6 of the resin case 3 to interconnect the flat cables 1 and 2, when the flat cables 1 and 2 separately have the plural circuit conductors 1A and 2A as shown in FIG. 27, the contact pressure between each of the circuit conductors 1A and 2A situated in the middle of the flat cables 1 and 2 in the width direction thereof and the circuit conductor 5A situated in the middle of the flat cable small piece 5 in the width direction thereof may be lower than the contact pressure between each of circuit conductors 1A and 2A situated at or near either end of the flat cables 1 and 2 in the width direction thereof and the corresponding circuit conductor 5A situated at or near either end of the flat cable small piece 5 in the width direction thereof, disadvantageously.

When plural circuits thus vary in contact pressure, it should be difficult to achieve a reliable connected state.

Besides, the connector of JPH 05-75248 A is configured to interconnect the circuit conductors 1A of the flat cable 1 and the circuit conductors 2A of the flat cable 2 via the circuit conductors 5A of the flat cable small piece 5, and this results in increased size of the connection structure.

SUMMARY OF THE INVENTION

The present invention has been made to overcome the conventional problems as above and aims at providing a connector that enables reliable connection between two circuit boards.

The present invention also aims at providing a circuit board assembly in which two circuit boards are connected by means of the connector.

The present invention also aims at providing a connection structure that enables size reduction.

A connector according to the present invention comprises:

a first connector portion in which two or more projection units project from a surface of a base plate; and a second connector portion constituted of a fitting plate in which two or more fitting hole units corresponding to the two or more projection units are formed, wherein the first connector portion has at least one locking portion that is elastically deformable and is situated between, of the two or more projection units, at least one pair of adjacent projection units, wherein the second connector portion has at least one portion to be locked corresponding to the at least one locking portion of the first connector portion, wherein at least one of the two or more projection units and the two or more fitting hole units have elasticity, and wherein when the first connector portion and the second connector portion are fitted with each other, each of the two or more projection units of the first connector portion is fitted into each of the two or more fitting hole units of the second connector portion as catching a first contact portion of a first circuit board and a second contact portion of a second circuit board that face to be overlapped on each other, and the first contact portion of the first circuit board and the second contact portion of the second circuit board are elastically pressed into contact with each other and thus electrically connected to each other between a lateral surface of each of the two or more projection units and an inner surface of each of the two or more fitting hole units, while each of the at least one locking portion is caught on a corresponding portion to be locked whereby a fitting state between the first connector portion and the second connector portion is locked.

A circuit board assembly according to the present invention comprises:

a first circuit board having a first contact portion that is bendable;

a second circuit board having a second contact portion that is bendable; and the above-described connector, wherein each of the two or more projection units of the first connector portion is fitted into each of the two or more fitting hole units of the second connector portion as catching the first contact portion of the first circuit board and the second contact portion of the second circuit board that face to be overlapped on each other, and the first contact portion of the first circuit board and the second contact portion of the second circuit board are elastically pressed into contact with each other and thus electrically connected to each other between the lateral surface of each of the two or more projection units and the inner surface of each of the two or more fitting hole units, and wherein each of the at least one locking portion is caught on a corresponding portion to be locked whereby a fitting state between the first connector portion and the second connector portion is locked.

A connection structure according to the present invention comprises:

a first connector portion in which a pair of spring pieces facing each other are formed on a surface of a base plate; and a second connector portion constituted of a fitting plate, the fitting plate having a pair of spring piece insertion holes that receive therein the pair of spring pieces separately and a partition portion that separates between the pair of spring piece insertion holes, wherein the pair of spring pieces of the first connector portion are fitted into the pair of spring piece insertion holes of the second connector portion as catching a first contact portion of a first circuit board and a second contact portion of a second circuit board that face to be overlapped on each other, and the first contact portion of the first circuit board and the second contact portion of the second circuit board are elastically pressed into contact with each other and thus electrically connected to each other between lateral surfaces of the pair of spring pieces and opposite lateral surfaces of the partition portion.

BRIEF DESCRIPTION OF THE DRAWINGS

FIG. 2 is a perspective view of the first connector portion, the first circuit board, the second circuit board and the second connector portion of the circuit board assembly according to Embodiment 1 before assembling, when viewed from an obliquely lower position.

FIG. 3 is an enlarged partial view showing a top surface of the first circuit board in Embodiment 1.

FIG. 15 is a partial perspective view of the second connector portion when viewed from an obliquely upper position.

FIG. 16 is a cross-sectional view taken along line B-B in FIG. 14.

FIG. 17 is a perspective view of the circuit board assembly according to Embodiment 1 when viewed from an obliquely upper position.

DETAILED DESCRIPTION OF THE INVENTION

Embodiments of the present invention are described below based on the appended drawings.

Embodiment 1

Figure 1:
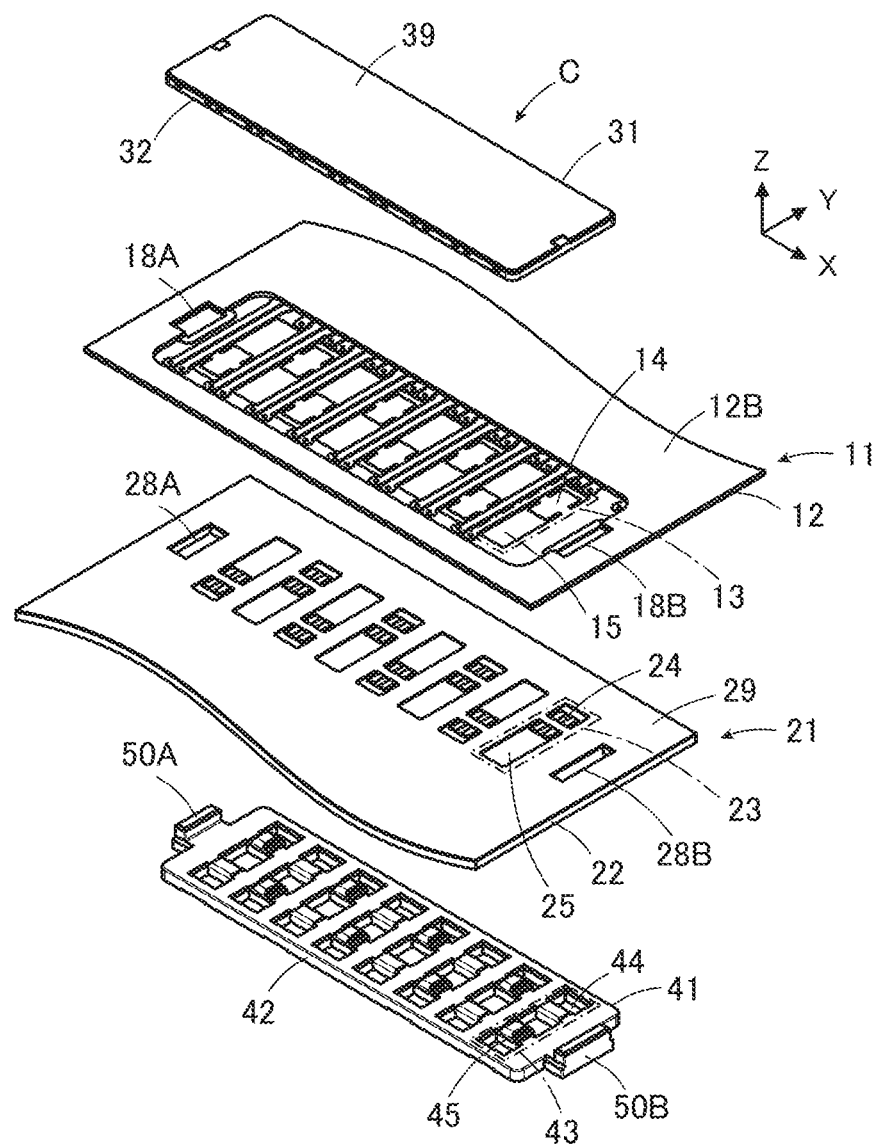
FIG. 1 is a perspective view of a first connector portion, a first circuit board, a second circuit board and a second connector portion of a circuit board assembly according to Embodiment 1 of the present invention before assembling, when viewed from an obliquely upper position.

FIGS. 1 and 2 show a first circuit board 11, a second circuit board 21 and a connector C that are used in a circuit board assembly according to Embodiment 1, before assembling. The connector C is composed of a first connector portion 31 and a second connector portion 41 that can be fitted with each other. The first circuit board 11, the second circuit board 21, the first connector portion 31 and the second connector portion 41 are each a flat plate member and are arranged parallel to each other. The first circuit board 11 and the second circuit board 21 are sequentially arranged between the first connector portion 31 and the second connector portion 41.

For convenience, the first circuit board 11, the second circuit board 21, the first connector portion 31 and the second connector portion 41 are defined as extending along an XY plane, and the direction from the second connector portion 41 to the first connector portion 31 is referred to as "+Z direction."

The first circuit board 11 includes a flexible, insulating first substrate 12. Eight rectangular unit regions 13 each extending in the Y direction that is the length direction of the first circuit board 11 are arranged on the first substrate 12 in the X direction that is the width direction of the first circuit board 11. Each unit region 13 is provided with a bendable first contact portion 14 and a rectangular opening 15 and is divided into two sections in the Y direction due to the presence of the first contact portion 14 and the opening 15.

Of the eight unit regions 13, four unit regions 13 arranged in every other row in the X direction are each provided with the first contact portion 14 on the −Y direction side and the opening 15 on the +Y direction side, while the other four unit regions 13 are each provided with the first contact portion 14 on the +Y direction side and the opening 15 on the −Y direction side. That is, the eight first contact portions 14 are arranged in the X direction in two rows, the opening 15 is situated between two first contact portions 14 adjacent to each other in the X direction, and the first contact portion 14 and the opening 15 are adjacent to each other in the Y direction across the two rows extending in the X direction.

Figure 4:
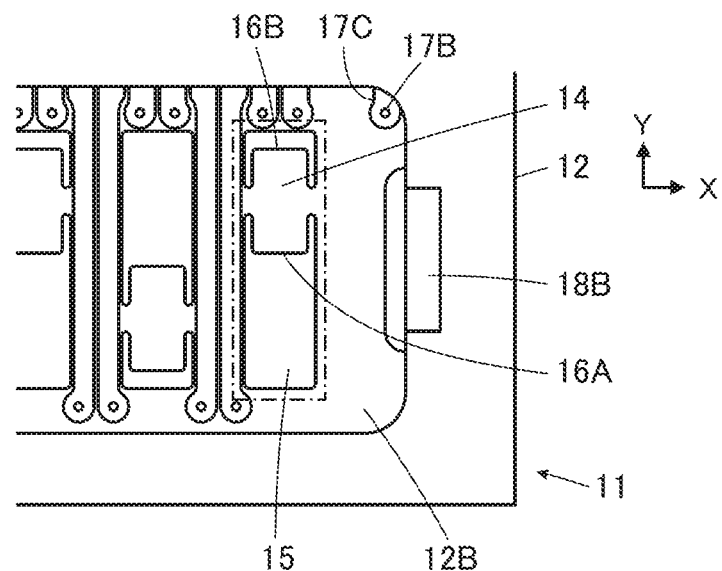
FIG. 4 is an enlarged partial view showing a bottom surface of the first circuit board in Embodiment 1.

As shown in FIGS. 3 and 4, a pair of first projection pieces 16A and 16B formed by cutting out the first substrate 12 are disposed in an area where the first contact portion 14 is formed, within each unit region 13. The first projection piece 16A projects toward the −Y direction, and the first projection piece 16B is connected to the +Y directional end of the first projection piece 16A and projects toward the +Y direction.

As shown in FIG. 3, on the top surface 12A of the first substrate 12, a pair of conductive first contacts 14A are formed separately at the −X and +X directional ends of the first projection piece 16A, while a pair of conductive first contacts 14B are formed separately at the −X and +X directional ends of the first projection piece 16B. Thus, the four contacts in total including the pair of first contacts 14A and the pair of first contacts 14B constitute the first contact portion 14. These four contacts are insulated from each other and are each connected to the corresponding, conductive first wiring portion 17C on the bottom surface 12B of the first substrate 12 shown in FIG. 4 through the corresponding, conductive first wiring portion 17A and via 17B.

As shown in FIG. 4, the first projection pieces 16A and 16B formed of part of the first substrate 12 having insulation properties are exposed as they are on the bottom surface 12B of the first substrate 12.

As shown in FIGS. 1 and 2, the first circuit board 11 is provided with rectangular, positioning through-holes 18A and 18B separately on the −X and +X direction sides of the eight unit regions 13 arranged in the X direction. The positioning through-hole 18B on the +X direction side has a Y directional length larger than that of the positioning through-hole 18A on the −X direction side.

The second circuit board 21 has the same structure as the first circuit board 11. Specifically, the second circuit board 21 includes a flexible, insulating second substrate 22. Eight rectangular unit regions 23 each extending in the Y direction that is the length direction of the second circuit board 21 are arranged on the second substrate 22 in the X direction that is the width direction of the second circuit board 21. Each unit region 23 is provided with a bendable second contact portion 24 and a rectangular opening 25 and is divided into two sections in the Y direction due to the presence of the second contact portion 24 and the opening 25.

Of the eight unit regions 23, four unit regions 23 arranged in every other row in the X direction are each provided with the second contact portion 24 on the +Y direction side and the opening 25 on the −Y direction side, while the other four unit regions 23 are each provided with the second contact portion 24 on the −Y direction side and the opening 25 on the +Y direction side. That is, the eight second contact portions 24 are arranged in the X direction in two rows, the opening 25 is situated between two second contact portions 24 adjacent to each other in the X direction, and the second contact portion 24 and the opening 25 are adjacent to each other in the Y direction across the two rows extending in the X direction.

Figure 5:
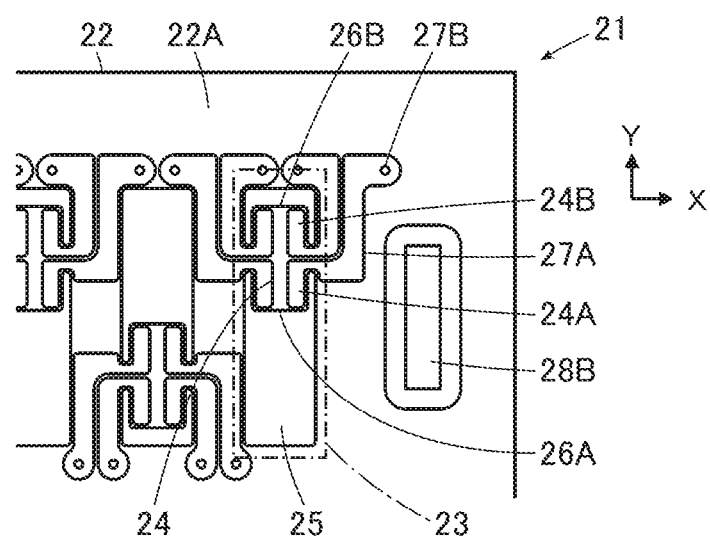
FIG. 5 is an enlarged partial view showing a top surface of the second circuit board in Embodiment 1.
Figure 6:
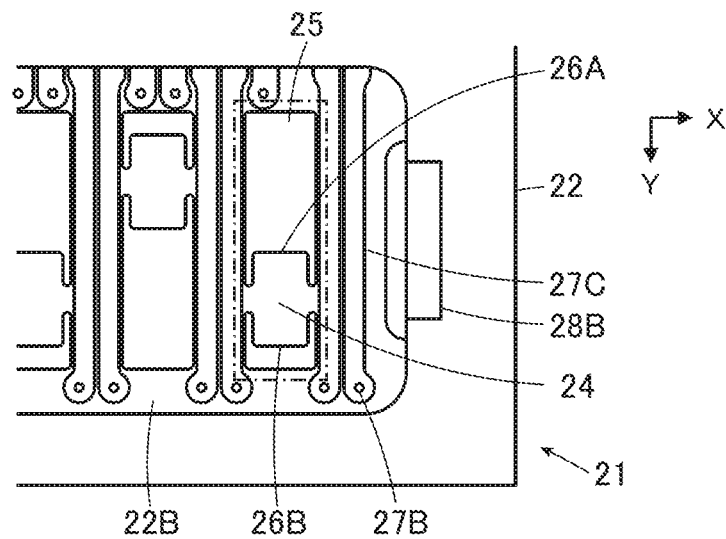
FIG. 6 is an enlarged partial view showing a bottom surface of the second circuit board in Embodiment 1.

As shown in FIGS. 5 and 6, a pair of second projection pieces 26A and 26B formed by cutting out the second substrate 22 are disposed in an area where the second contact portion 24 is formed, within each unit region 23. The second projection piece 26A projects toward the −Y direction, and the second projection piece 26B is connected to the +Y directional end of the second projection piece 26A and projects toward the +Y direction.

As shown in FIG. 5, on the top surface 22A of the second substrate 22, a pair of conductive second contacts 24A are formed separately at the −X and +X directional ends of the second projection piece 26A, while a pair of conductive second contacts 24B are formed separately at the −X and +X directional ends of the second projection piece 26B. Thus, the four contacts in total including the pair of second contacts 24A and the pair of second contacts 24B constitute the second contact portion 24. These four contacts are insulated from each other and are each connected to the corresponding, conductive second wiring portion 27C on the bottom surface 22B of the second substrate 22 shown in FIG. 6 through the corresponding, conductive second wiring portion 27A and via 27B.

As shown in FIG. 6, the second projection pieces 26A and 26B formed of part of the second substrate 22 having insulation properties are exposed as they are on the bottom surface 22B of the second substrate 22.

As is evident from the comparison between FIGS. 3 and 5, when the first circuit board 11 and the second circuit board 21 are seen from the top surface 12A side of the first substrate 12 and the top surface 22A side of the second substrate 22, respectively, the arrangement of the second contact portion 24 and the opening 25 in each unit region 23 of the second circuit board 21 has the opposite positional relationship in the Y direction from that of the first contact portion 14 and the opening 15 in the corresponding unit region 13 of the first circuit board 11.

As shown in FIGS. 1 and 2, the second circuit board 21 is provided with rectangular, positioning through-holes 28A and 28B separately on the −X and +X direction sides of the eight unit regions 23 arranged in the X direction. Those positioning through-holes 28A and 28B have slightly larger Y directional lengths than those of the positioning through-holes 18A and 18B of the first circuit board 11, respectively, and the positioning through-hole 28B on the +X direction side has a Y directional length larger than that of the positioning through-hole 28A on the −X direction side.

Figure 7:
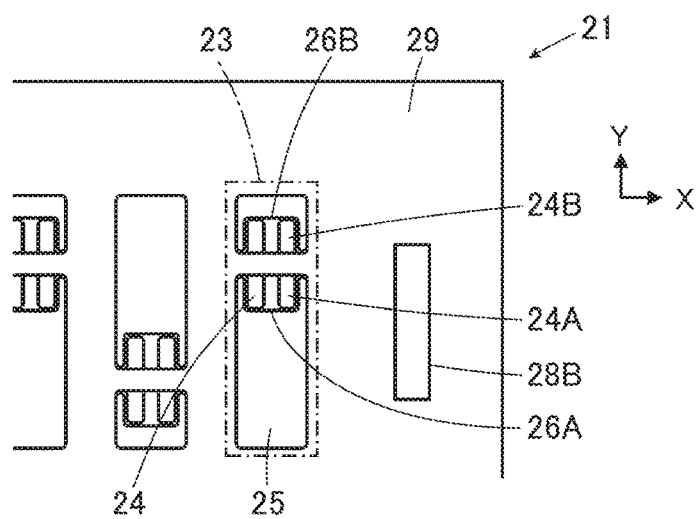
FIG. 7 is an enlarged partial view showing the second circuit board provided on its surface with an insulating layer.

In order to prevent the first wiring portion 17A of the first circuit board 11 and the second wiring portion 27A of the second circuit board 21 from being short-circuited when the first connector portion 31 and the second connector portion 41 of the connector C are fitted with each other so that the top surface of the first circuit board 11 and the top surface of the second circuit board 21 are brought into contact with each other, the top surface of the second circuit board 21 is provided with an insulating layer 29 as shown in FIG. 7. The insulating layer 29 is formed to cover the second circuit board 21 except for the opening 25, the second projection pieces 26A and 26B, the pair of second contacts 24A and the pair of second contacts 24B formed on the top surfaces of these second projection pieces 26A and 26B of each unit region 23, and the positioning through-holes 28A and 28B.

In FIG. 1, the second circuit board 21 having the insulating layer 29 formed on its surface is shown.

Since the insulating layer 29 is provided to prevent a short circuit between the first wiring portion 17A of the first circuit board 11 and the second wiring portion 27A of the second circuit board 21, an insulating layer may be formed on the top surface of the first circuit board 11 instead of the second circuit board 21, or alternatively, insulating layers may be formed on the top surfaces of both of the first and second circuit boards 11 and 21.

Figure 8:
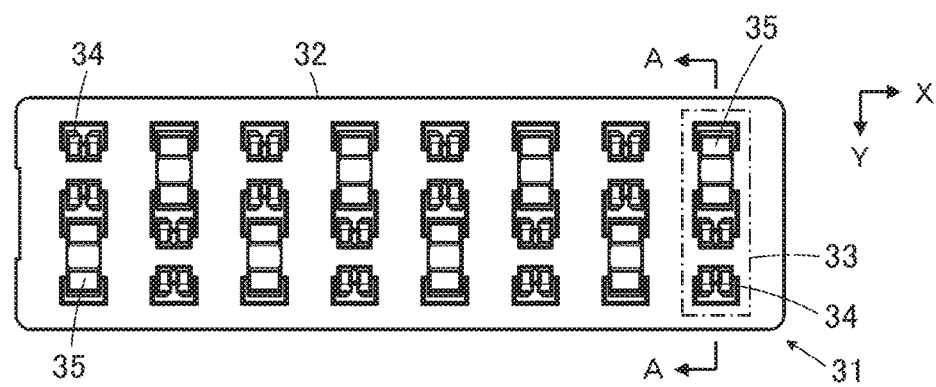
FIG. 8 is a bottom view showing the first connector portion.

As shown in FIGS. 1 and 2, the first connector portion 31 of the connector C has a base plate 32 having insulation properties, and eight rectangular unit regions 33 each extending in the Y direction are arranged in the X direction on the base plate 32. As shown in FIG. 8, a projection unit 34 and a locking portion 35 are formed in each unit region 33 to divide the associated unit region 33 in the Y direction.

Of the eight unit regions 33, four unit regions 33 arranged in every other row in the X direction are each provided with the projection unit 34 on the +Y direction side and the locking portion 35 on the −Y direction side, while the other four unit regions 33 are each provided with the projection unit 34 on the −Y direction side and the locking portion 35 on the +Y direction side. That is, the eight projection units 34 are arranged in the X direction in two rows, the locking portion 35 is situated between two projection units 34 adjacent to each other in the X direction, and the projection unit 34 and the locking portion 35 are adjacent to each other in the Y direction across the two rows extending in the X direction.

Figure 9:
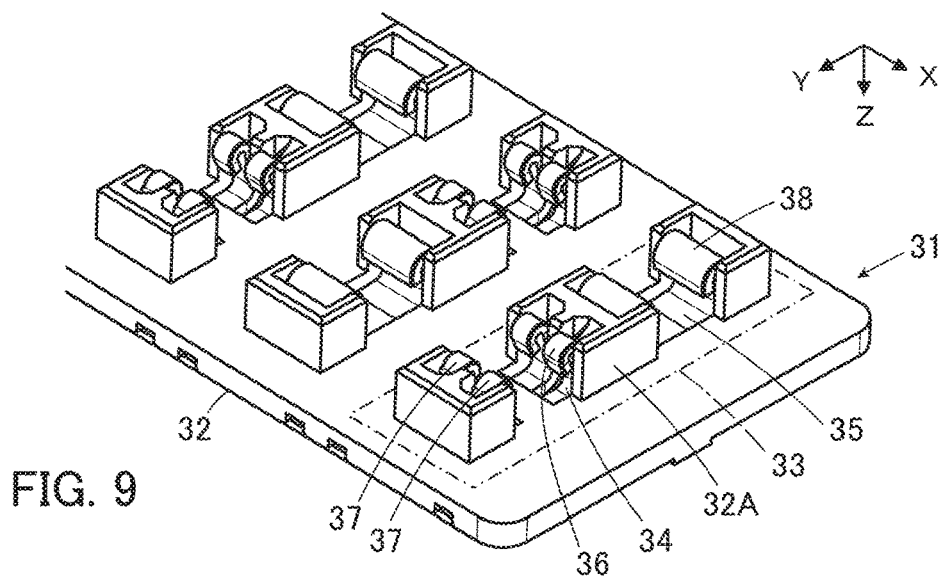
FIG. 9 is a partial perspective view of the first connector portion when viewed from an obliquely lower position.

As shown in FIG. 9, the projection unit 34 formed in each unit region 33 is constituted of a metal spring and includes a pair of spring pieces 36 facing each other in the Y direction. Each spring piece 36 is divided into two arm portions 37 aligned in the X direction, projects from the base plate 32 toward the −Z direction, and has elasticity in the Y direction.

The locking portion 35 disposed adjacent to the projection unit 34 in the Y direction has a pair of locking pieces 38 made of a metal material and facing each other in the Y direction. The locking pieces 38 project from the base plate 32 toward the −Z direction and are formed to be elastically deformable in the Y direction.

Figure 10:
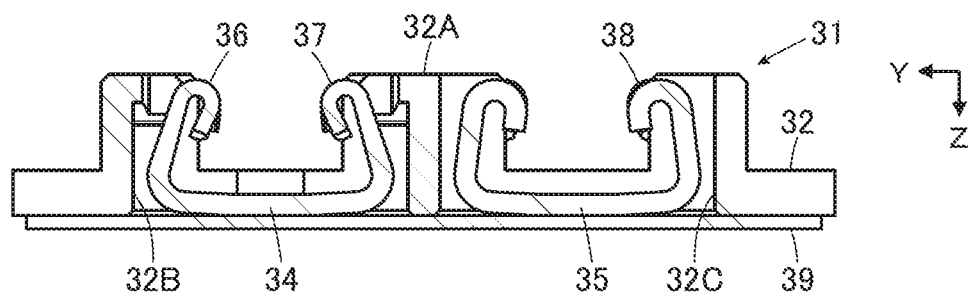
FIG. 10 is a cross-sectional view taken along line A-A in FIG. 8.

Each unit region 33 of the base plate 32 is further provided, on the surface of the base plate 32 on the −Z direction side, with a protection wall portion 32A projecting from the base plate 32 toward the −Z direction so as to surround the projection unit 34 and the locking portion 35. As shown in FIG. 10, the protection wall portion 32A projects in the −Z direction beyond the projection unit 34 and the locking portion 35.

The base plate 32 has through-holes 32B and 32C in regions surrounded by the protection wall portion 32A, and the projection unit 34 and the locking portion 35 are, while being inserted in the through-holes 32B and 32C, held in the base plate 32. An insulating sheet 39 is fixed on the surface of the base plate 32 on the +Z direction side, and those parts of the projection unit 34 and the locking portion 35 that face in the +Z direction are covered with the insulating sheet 39.

Figure 11:
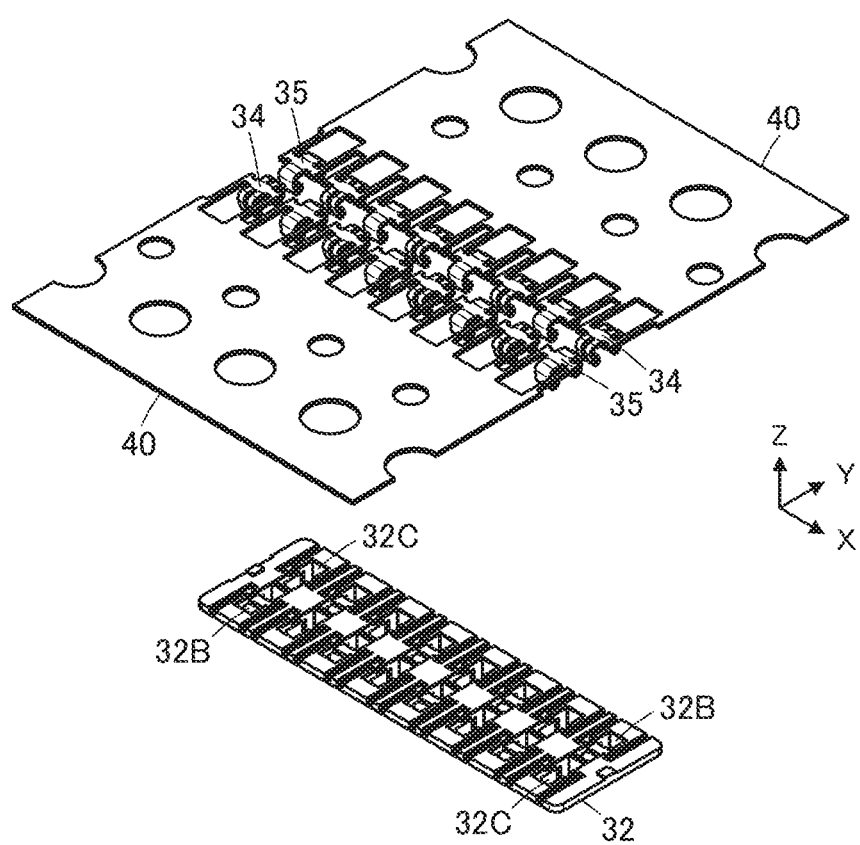
FIG. 11 is a perspective view showing the state where plural projections and plural locking portions joined to carriers are aligned with a base plate of the first connector portion.

The first connector portion 31 as above can be produced by the following procedures. First, as shown in FIG. 11, the plural projection units 34 and the plural locking portions 35 joined to two carriers 40 are positioned on the +Z direction side of the base plate 32. Four projection units 34 and four locking portions 35 alternately arranged in the X direction are joined to each carrier 40, and the projection units 34 are positioned on the +Z direction side of the corresponding through-holes 32B in the base plate 32 while the locking portions 35 are positioned on the +Z direction side of the corresponding through-holes 32C in the base plate 32.

Figure 12:
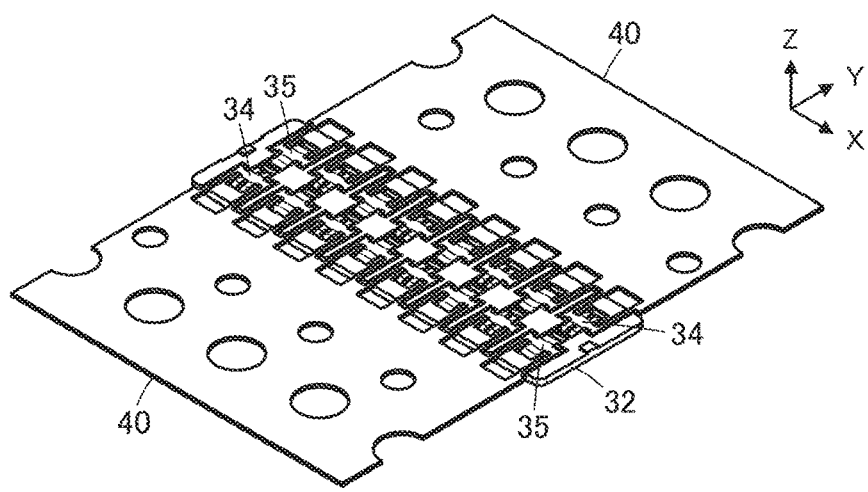
FIG. 12 is a perspective view showing the state where the plural projections and the plural locking portions joined to the carriers are fitted with the base plate of the first connector portion.

Next, as shown in FIG. 12, the two carriers 40 are each moved relative to the base plate 32 so that the projection units 34 are press-fitted into the corresponding through-holes 32B in the base plate 32 and the locking portions 35 are press-fitted into the corresponding through-holes 32C in the base plate 32.

Figure 13:
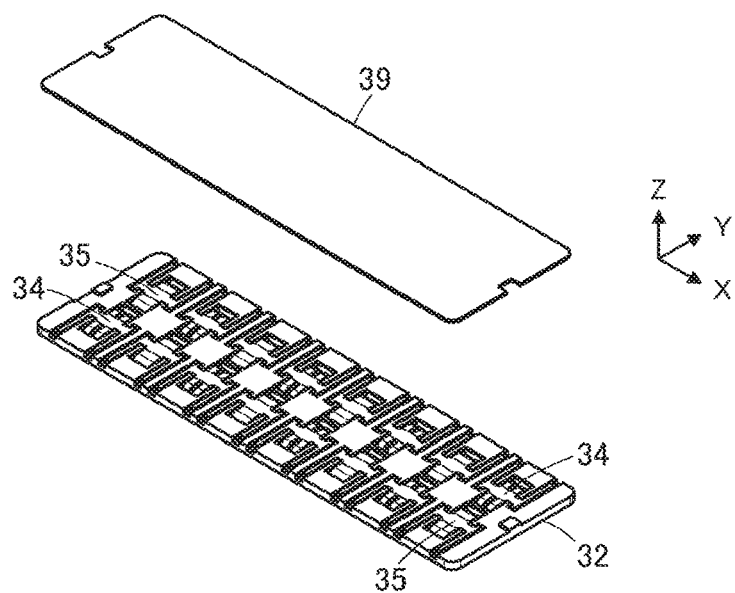
FIG. 13 is a perspective view showing the state where an insulating sheet is aligned with the base plate of the first connector portion.

Then, after the two carriers 40 are separated from the projection units 34 and the locking portions 35, as shown in FIG. 13, the insulating sheet 39 is aligned with the surface of the base plate 32 on the +Z direction side and fixed to the base plate 32 by laser welding, thermocompression bonding or another process. Thus, the first connector portion 31 is produced.

Figure 14:
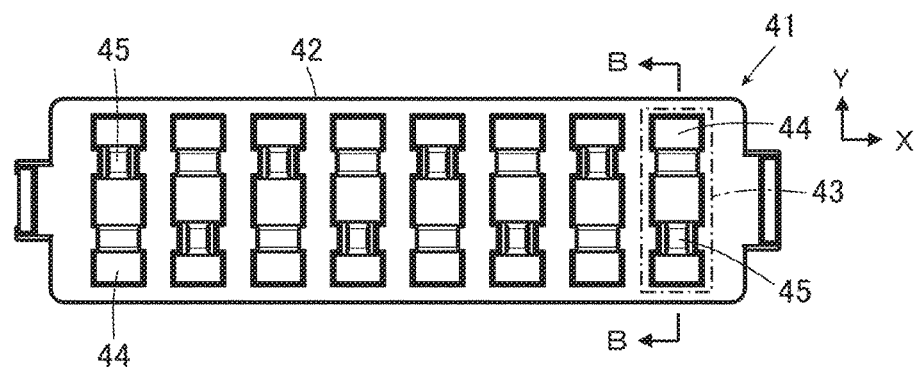
FIG. 14 is a plan view showing the second connector portion.

As shown in FIGS. 1 and 2, the second connector portion 41 of the connector C has a fitting plate 42 having insulation properties, and eight rectangular unit regions 43 each extending in the Y direction are arranged on the fitting plate 42 in the X direction. As shown in FIG. 14, a fitting hole unit 44 and a portion to be locked 45 are formed in each unit region 43 to divide the associated unit region 43 in two in the Y direction. That is, the eight fitting hole units 44 are arranged in the X direction in two rows, the portion to be locked 45 is situated between two fitting hole units 44 adjacent to each other in the X direction, and the fitting hole unit 44 and the portion to be locked 45 are adjacent to each other in the Y direction across the two rows extending in the X direction.

As shown in FIG. 15, the fitting hole unit 44 formed in each unit region 43 includes a pair of spring piece insertion holes 46 penetrating the fitting plate 42 in the Z direction and disposed away from each other in the Y direction, and the fitting plate 42 has a partition portion 47 separating between the pair of spring piece insertion holes 46. The pair of spring piece insertion holes 46 are provided to receive therein the pair of spring pieces 36 of the corresponding projection unit 34 of the first connector portion 31 upon fitting between the first connector portion 31 and the second connector portion 41. Opposite lateral surfaces of the partition portion 47 in the Y direction form an inner surface of the fitting hole unit 44, and the ends of the pair of spring pieces 36 inserted in the pair of spring piece insertion holes 46 elastically sandwich the partition portion 47 from its opposite lateral surfaces in the Y direction when the first connector portion 31 and the second connector portion 41 are fitted with each other.

It is assumed that the shortest distance in the Y direction between the end portions of the pair of spring pieces 36 of the first connector portion 31 in a natural state where the first connector portion 31 and the second connector portion 41 are separated is set to be smaller than the value obtained by adding a value twice the thickness of the first circuit board 11 and a value twice the thickness of the second circuit board 21 to the Y directional length of the partition portion 47 between the pair of spring piece insertion holes 46 of the second connector portion 41. The term "Y directional length of the partition portion 47" herein refers to the Y directional length of the partition portion 47 in the position where the pair of spring pieces 36 come into contact.

The unit region 43 is provided with a pair of locking piece insertion holes 48 penetrating the fitting plate 42 in the Z direction and disposed away from each other in the Y direction, and the portion to be locked 45 is situated between the pair of locking piece insertion holes 48. That is, the locking piece insertion holes 48 are separately formed on the opposite sides of the portion to be locked 45 in the Y direction. The pair of locking piece insertion holes 48 are provided to receive therein the pair of locking pieces 38 of the corresponding locking portion 35 of the first connector portion 31 upon fitting between the first connector portion 31 and the second connector portion 41. A spring piece insertion hole 46 and a locking piece insertion hole 48 are situated adjacent to each other in the Y direction and communicate with each other between the partition portion 47 and the portion to be locked 45 to form a single opening in each unit region 43.

The portion to be locked 45 has a pair of step portions 49 that are situated at the opposite ends of the portion to be locked 45 in the Y direction and face in the −Z direction. The pair of step portions 49 are provided to catch the ends of the pair of locking pieces 38 of the corresponding locking portion 35 of the first connector portion 31 upon fitting between the first connector portion 31 and the second connector portion 41.

As shown in FIGS. 1 and 2, the second connector portion 41 has a pair of positioning protrusions 50A and 50B separately formed at the −X and +X directional ends of the fitting plate 42 and protruding in the +Z direction. The positioning protrusions 50A and 50B each have a shape whose Y directional length changes in two stages as advancing from the base portion to the top portion in the +Z direction. The positioning protrusion 50A on the −X direction side has the base portion whose Y directional length is smaller than that of the positioning through-hole 28A of the second circuit board 21 on the −X direction side and larger than that of the positioning through-hole 18A of the first circuit board 11 on the −X direction side, and the top portion whose Y directional length is smaller than that of the positioning through-hole 18A of the first circuit board 11 on the −X direction side. Similarly, the positioning protrusion 50B on the +X direction side has the base portion whose Y directional length is smaller than that of the positioning through-hole 28B of the second circuit board 21 on the +X direction side and larger than that of the positioning through-hole 18B of the first circuit board 11 on the +X direction side, and the top portion whose Y directional length is smaller than that of the positioning through-hole 18B of the first circuit board 11 on the +X direction side.

This configuration allows the second circuit board 21 and the first circuit board 11 to be sequentially stacked in this order on the second connector portion 41 as shown in FIGS. 1 and 2, while preventing those circuit boards to be sequentially stacked in a wrong order, i.e., in the order of the first circuit board 11 and the second circuit board 21 on the second connector portion 41.

The positioning through-holes 18A and 18B of the first circuit board 11, the positioning through-holes 28A and 28B of the second circuit board 21, and the positioning protrusions 50A and 50B of the second connector portion 41 constitute a positioning mechanism.

When the circuit board assembly is assembled using the first circuit board 11, the second circuit board 21 and the connector C as above, firstly, as shown in FIGS. 1 and 2, the first connector portion 31, the first circuit board 11, the second circuit board 21 and the second connector portion 41 are aligned in this order in the Z direction. At this time, the first circuit board 11 and the second circuit board 21 are arranged such that the top surface 12A of the first substrate 12 of the first circuit board 11 face the top surface 22A of the second substrate 22 of the second circuit board 21.

The arrangement of the second contact portion 24 and the opening 25 in each unit region 23 of the second circuit board 21 has the opposite positional relationship in the Y direction from that of the first contact portion 14 and the opening 15 in the corresponding unit region 13 of the first circuit board 11; accordingly, the first contact portion 14 of the first circuit board 11, the second contact portion 24 of the second circuit board 21, and the fitting hole unit 44 of the second connector portion 41 are sequentially disposed on the −Z direction side of the projection unit 34 of the first connector portion 31, and similarly, the opening 15 of the first circuit board 11, the opening 25 of the second circuit board 21, and the portion to be locked 45 of the second connector portion 41 are sequentially disposed on the −Z direction side of the locking portion 35 of the first connector portion 31.

Figure 18:
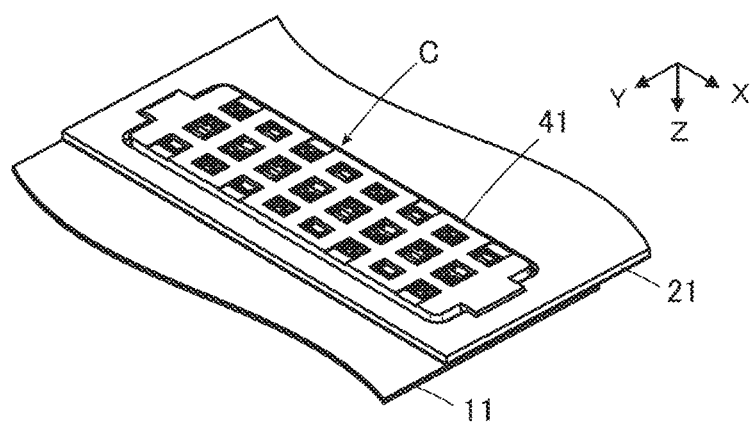
FIG. 18 is a perspective view of the circuit board assembly according to Embodiment 1 when viewed from an obliquely lower position.

In this state, the first connector portion 31 is relatively moved in the −Z direction toward the second connector portion 41, whereby the projection units 34 of the first connector portion 31 are fitted into the fitting hole units 44 of the second connector portion 41 as catching the first contact portions 14 of the first circuit board 11 and the second contact portions 24 of the second circuit board 21. At the same time, the locking portions 35 of the first connector portion 31 are fitted to the portions to be locked 45 of the second connector portion 41 through the openings 15 of the first circuit board 11 and the openings 25 of the second circuit board 21. Thus, the circuit board assembly is assembled in which the first circuit board 11 and the second circuit board 21 are sandwiched between the first connector portion 31 and the second connector portion 41 as shown in FIGS. 17 and 18.

Figure 19:
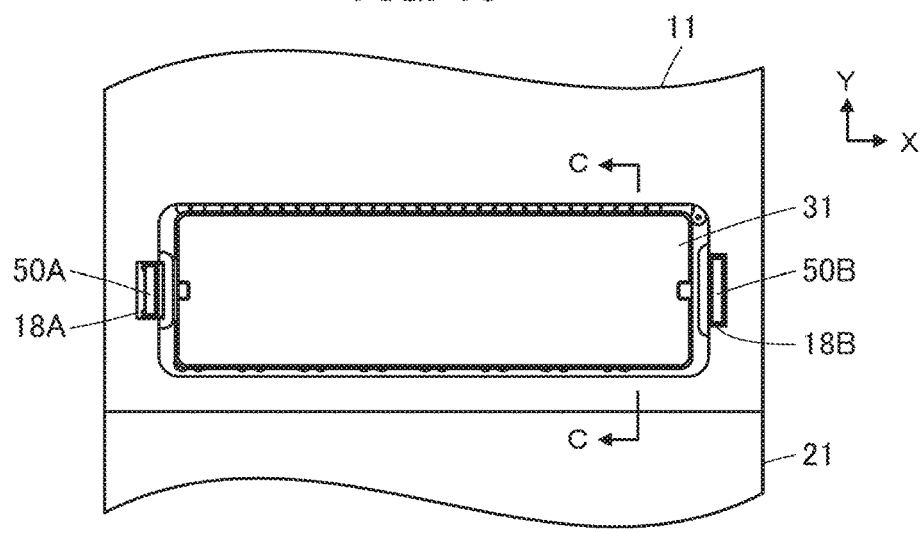
FIG. 19 is a plan view showing the circuit board assembly according to Embodiment 1.
Figure 20:
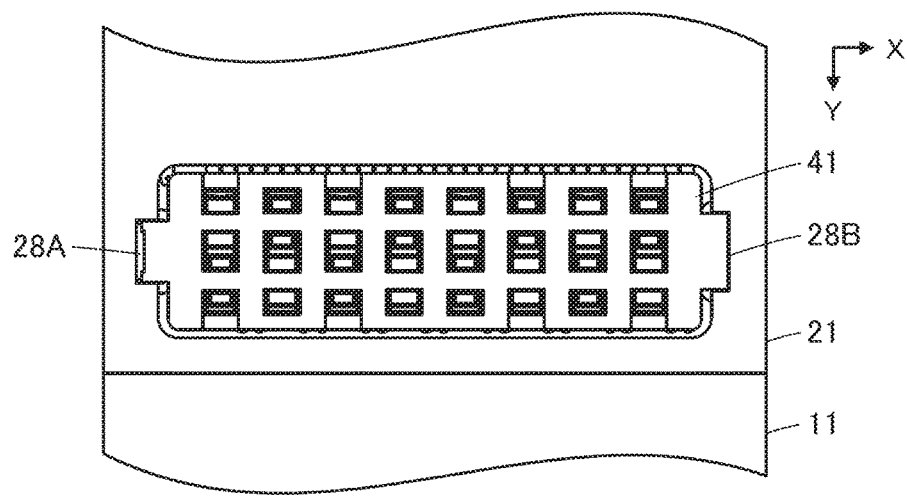
FIG. 20 is a bottom view showing the circuit board assembly according to Embodiment 1.

As shown in FIGS. 19 and 20, the positioning protrusions 50A and 50B of the second connector portion 41 are respectively inserted into the positioning through-holes 28A and 28B of the second circuit board 21 and the positioning through-holes 18A and 18B of the first circuit board 11, whereby the circuit board assembly can easily be assembled without misalignment of the first circuit board 11, the second circuit board 21 and the second connector portion 41 in any direction along an XY plane.

As described above, only by superposing the first circuit board 11 and the second circuit board 21 on each other and fitting the projection units 34 of the first connector portion 31 into the fitting hole units 44 of the second connector portion 41 via the first contact portions 14 of the first circuit board 11 and the second contact portions 24 of the second circuit board 21 while fitting the locking portions 35 of the first connector portion 31 to the portions to be locked 45 of the second connector portion 41 through the openings 15 of the first circuit board 11 and the openings 25 of the second circuit board 21, the circuit board assembly can be assembled, and thus the first circuit board 11 and the second circuit board 21 can readily be interconnected.

When the circuit board assembly is assembled, in the state where the second connector portion 41 is placed on a fixed surface of, for instance, a workbench, the first connector portion 31 may be pressed down from above toward the second connector portion 41 with the second circuit board 21 and the first circuit board 11 being sandwiched therebetween. Alternatively, this may be turned upside down; specifically, in the state where the first connector portion 31 is placed on a fixed surface, the second connector portion 41 may be pressed down from above toward the first connector portion 31 with the first circuit board 11 and the second circuit board 21 being sandwiched therebetween.

Figure 21:
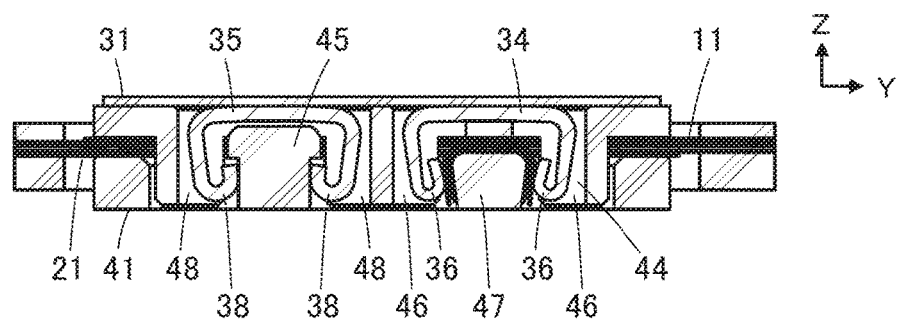
FIG. 21 is a cross-sectional view taken along line C-C in FIG. 19.

A cross section of the circuit board assembly thus assembled cut along a YZ plane is shown in FIG. 21. The pair of spring pieces 36 of the projection unit 34 of the first connector portion 31 are inserted in the pair of spring piece insertion holes 46 of the fitting hole unit 44 of the second connector portion 41, while the pair of locking pieces 38 of the locking portion 35 of the first connector portion 31 are inserted in the pair of locking piece insertion holes 48 of the second connector portion 41.

Figure 22:
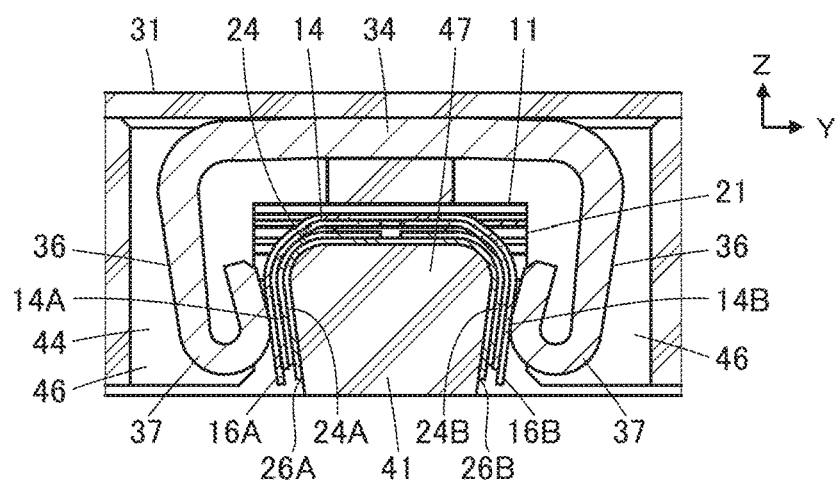
FIG. 22 is an enlarged partial view of FIG. 21 for showing the fitting state between a projection unit of the first connector portion and a fitting hole unit of the second connector portion.

As shown in FIG. 22, when the pair of spring pieces 36 of the projection unit 34 of the first connector portion 31 are inserted in the pair of spring piece insertion holes 46 of the fitting hole unit 44 of the second connector portion 41, the pair of first projection pieces 16A and 16B of the first circuit board 11 and the pair of second projection pieces 26A and 26B of the second circuit board 21 are pushed in the −Z direction by the pair of spring pieces 36 of the projection unit 34 to thereby bend in the −Z direction along the partition portion 47 of the second connector portion 41.

Separately and correspondingly, the pairs of first contacts 14A and 14B formed on the pair of first projection pieces 16A and 16B of the first circuit board 11 bending in the −Z direction and the pairs of second contacts 24A and 24B formed on the pair of second projection pieces 26A and 26B of the second circuit board 21 bending in the −Z direction face and overlap each other, and are sandwiched by the pair of spring pieces 36 of the projection unit 34 of the first connector portion 31 and the opposite lateral surfaces, in the Y direction, of the partition portion 47 of the second connector portion 41. Since the pair of spring pieces 36 have elasticity in the Y direction, the pairs of first contacts 14A and 14B of the first circuit board 11 and the pairs of second contacts 24A and 24B of the second circuit board 11 are elastically pressed into contact with each other between the lateral surfaces of the spring pieces 36, which form a lateral surface of the projection unit 34, and the lateral surfaces of the partition portion 47, which form an inner surface of the fitting hole unit 44, and are thereby electrically connected to each other in a reliable manner.

As shown in FIGS. 3 and 5, the first contact 14A is formed at each of the −X and +X directional ends of the first projection piece 16A of the first circuit board 11, while the first contact 14B is formed at each of the −X and +X directional ends of the first projection piece 16B thereof, and the second contact 24A is formed at each of the −X and +X directional ends of the second projection piece 26A of the second circuit board 21, while the second contact 24B is formed at each of the −X and +X directional ends of the second projection piece 26B thereof; and as shown in FIG. 9, each spring piece 36 of the projection unit 34 of the first connector portion 31 is divided into the two arm portions 37 aligned in the X direction.

Accordingly, the pair of first contacts 14A separately formed at the −X and +X directional ends of the first projection piece 16A of the first circuit board 11 and the pair of second contacts 24A separately formed at the −X and +X directional ends of the second projection piece 26A of the second circuit board 21 receive elastic forces from their dedicated arm portions 37 and are thereby connected to each other, correspondingly. In the same manner, the pair of first contacts 14B separately formed at the −X and +X directional ends of the first projection piece 16B of the first circuit board 11 and the pair of second contacts 24B separately formed at the −X and +X directional ends of the second projection piece 26B of the second circuit board 21 receive elastic forces from their dedicated arm portions 37 and are thereby connected to each other, correspondingly. Thus, more reliable electric connection is established.

Figure 23:
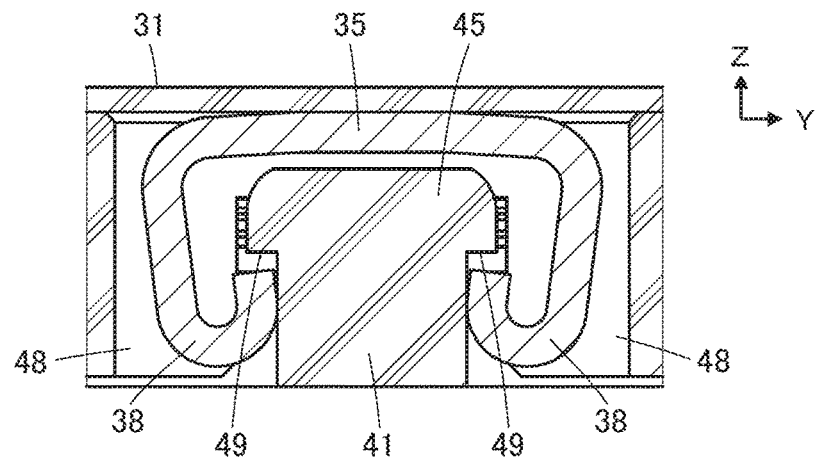
FIG. 23 is an enlarged partial view of FIG. 21 for showing the catching state between a locking portion of the first connector portion and a portion to be locked of the second connector portion.

As shown in FIG. 23, when the pair of elastically deformable locking pieces 38 of the locking portion 35 of the first connector portion 31 are separately inserted into the pair of locking piece insertion holes 48 of the second connector portion 41, the portion to be locked 45 situated between the pair of locking piece insertion holes 48 of the second connector portion 41 is elastically sandwiched from its opposite lateral surfaces in the Y direction by the ends of the pair of locking pieces 38. At this time, since the opposite ends of the portion to be locked 45 in the Y direction are provided with the pair of step portions 49 facing in the −Z direction, the ends of the pair of locking pieces 38 are caught on the pair of step portions 49. Therefore, even when a force acts to separate the first connector portion 31 and the second connector portion 41 from each other in the Z direction, the first connector portion 31 is prevented from coming off the second connector portion 41, and thus, the first circuit board 11 and the second circuit board 21 can be electrically connected in a stable manner.

In the first connector portion 31, the locking portion 35 is situated between two projection units 34 adjacent to each other in the X direction, and in the second connector portion 41, the portion to be locked 45 is situated between two fitting hole units 44 adjacent to each other in the X direction; therefore, the contact pressures between the first contact portions 14 of the first circuit board 11 and the corresponding second contact portions 24 of the second circuit board 21 are prevented from varying, so that each combination of the first contact portion 14 and the second contact portion 24 can have stable electrical connection.

Thus, the first circuit board 11 and the second circuit board 21 can be connected to each other with four electric path systems being formed in each fitting hole unit 44 of the second connector portion 41. Accordingly, although the number of the projection units 34 of the first connector portion 31 and that of the fitting hole units 44 of the second connector portion 41 are each "eight," it is possible to establish connections of electric signals of 32 systems in total.

There is provided the structure in which the projection unit 34 of the first connector portion 31 is fitted into the fitting hole unit 44 of the second connector 41 whereby the first contact portion 14 of the first circuit board 11 and the second contact portion 24 of the second circuit board 21 are bent and brought into direct contact with each other between the lateral surfaces of the spring pieces 36 of the projection unit 34 and the lateral surfaces of the partition portion 47 in the fitting hole unit 44, and this makes it possible to achieve a small-size connection structure, particularly a circuit board assembly that is extremely thin in the Z direction.

While, in Embodiment 1, the number of the projection units 34 of the first connector portion 31 and that of the fitting hole units 44 of the second connector portion 41 are each "eight," the invention is not limited thereto, and it suffices if the first connector portion 31 has at least two projection units 34 and the second connector portion 41 has at least two fitting hole units 44.

In Embodiment 1, the first circuit board 11 is constituted of a circuit board including the flexible first substrate 12 having insulation properties, and the second circuit board 21 is constituted of a circuit board including the flexible second substrate 22 having insulation properties; however, the invention is not limited thereto, and one or both of the first and second circuit boards may be each constituted of a printed circuit board or a rigid flexible printed circuit board as long as they have bendable first contact portions and bendable second contact portions.

While, in Embodiment 1, each spring piece 36 of the projection unit 34 constituted of a metal spring is divided into the two arm portions 37 aligned in the X direction, the invention is not limited thereto, and each spring piece 36 may have a single arm portion that is not divided in the X direction.

While, in Embodiment 1, the projection unit 34 of the first connector portion 31 has elasticity in the Y direction, the invention is not limited thereto. Even if the projection unit 34 of the first connector portion 31 does not have elasticity, as long as the partition portion 47 formed in the fitting hole unit 44 of the second connector portion 41 has elasticity in the Y direction, the first contact portion 14 of the first circuit board 11 and the second contact portion 24 of the second circuit board 21 can be elastically pressed against each other and electrically connected to each other upon being sandwiched between the lateral surfaces of the projection unit 34 of the first connector portion 31 and the lateral surfaces of the partition portion 47 of the second connector portion 41.

Both of the projection unit 34 of the first connector portion 31 and the partition portion 47 formed in the fitting hole unit 44 of the second connector portion 41 may have elasticity in the Y direction.

While the pair of step portions 49 facing in the −Z direction are formed at the portion to be locked 45 of the second connector portion 41 as shown in FIG. 16, the shape of the step portions 49 is not limited to that illustrated in FIG. 16. One example of alternative configurations may be as follows: The portion to be locked 45 has a pair of step portions gently inclined with respect to the Z direction, and the ends of the pair of locking pieces 38 of the first connector portion 31 are caught on the pair of step portions thus shaped, so that the fitting state between the first connector portion 31 and the second connector portion 41 is maintained, and when a Z directional force acts to separate the first connector portion 31 and the second connector portion 41 from each other, the fitting therebetween is released.

Embodiment 2

In Embodiment 1 above, the first contact portion 14 and the opening 15 of the first circuit board 11 are situated side by side in the Y direction, the second contact portion 24 and the opening 25 of the second circuit board 21 are situated side by side in the Y direction, the projection unit 34 and the locking portion 35 of the first connector portion 31 are situated side by side in the Y direction, and the fitting hole unit 44 and the portion to be locked 45 of the second connector portion 41 are situated side by side in the Y direction; however, the invention is not limited thereto.

Figure 24:
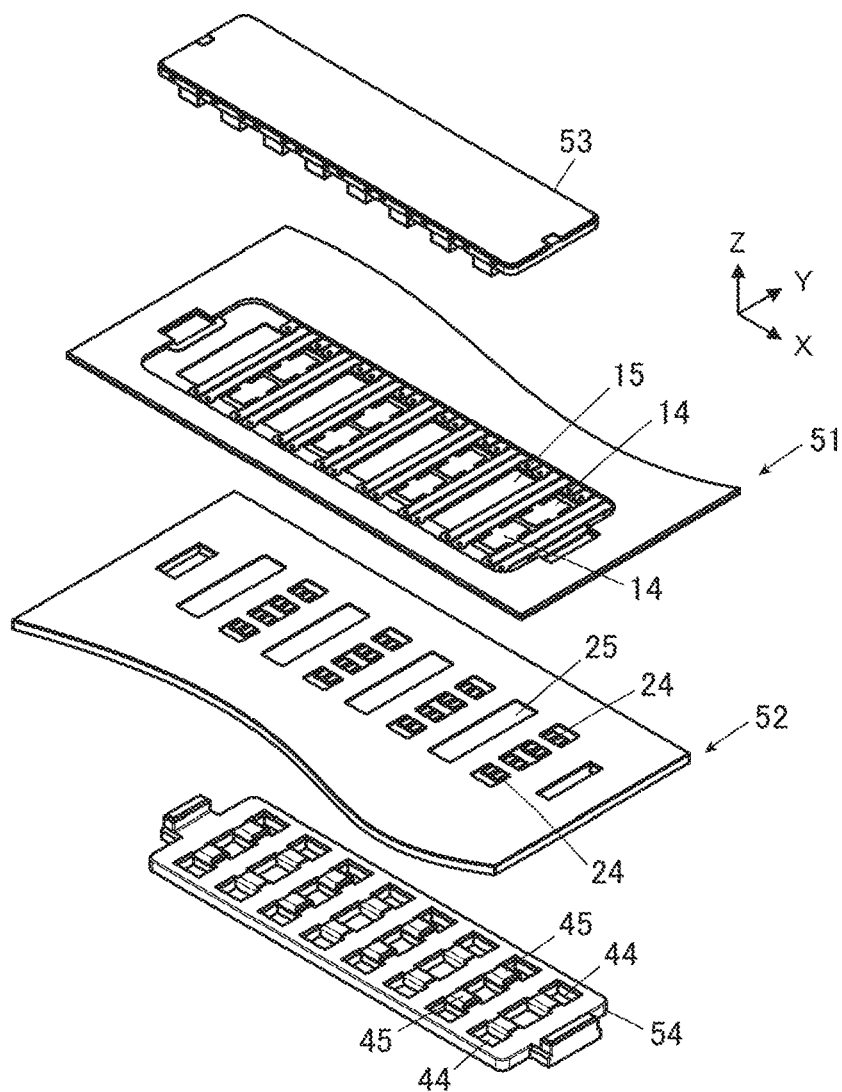
FIG. 24 is a perspective view of a first connector portion, a first circuit board, a second circuit board and a second connector portion of a circuit board assembly according to Embodiment 2 before assembling, when viewed from an obliquely upper position.

FIG. 24 shows a first connector portion 53, a first circuit board 51, a second circuit board 52 and a second connector portion 54 of a circuit board assembly according to Embodiment 2 before assembling.

The first circuit board 51 has, in total, eight first contact portions 14 arranged in the X direction in two rows. An opening 15 is situated between two first contact portions 14 adjacent to each other in the X direction, and two first contact portions 14 are adjacent to each other in the Y direction across the two rows extending in the X direction. For the opening 15, two openings 15 are also adjacent to each other in the Y direction across the two rows extending in the X direction and communicate with each other to form one opening elongated in the Y direction.

In the same manner, the second circuit board 52 has, in total, eight second contact portions 24 arranged in the X direction in two rows. An opening 25 is situated between two second contact portions 24 adjacent to each other in the X direction, and two second contact portions 24 are adjacent to each other in the Y direction across the two rows extending in the X direction. For the opening 25, two openings 25 are also adjacent to each other in the Y direction across the two rows extending in the X direction and communicate with each other to form one opening elongated in the Y direction.

The first connector portion 53 and the second connector portion 54 also have the structures corresponding to the first circuit board 51 and the second circuit board 52.

Specifically, the second connector portion 54 has, in total, eight fitting hole units 44 arranged in the X direction in two rows. A portion to be locked 45 is situated between two fitting hole units 44 adjacent to each other in the X direction, and two fitting hole units 44 are adjacent to each other in the Y direction across the two rows extending in the X direction. For the portion to be locked 45, two portions to be locked 45 are also adjacent to each other in the Y direction across the two rows extending in the X direction.

Although not illustrated, the first connector portion 53 has, in total, eight projection units 34 arranged in the X direction in two rows. A locking portion 35 is situated between two projection units 34 adjacent to each other in the X direction, and two projection units 34 are adjacent to each other in the Y direction across the two rows extending in the X direction. For the locking portion 35, two locking portions 35 are also adjacent to each other in the Y direction across the two rows extending in the X direction.

Even with the first connector portion 53, the first circuit board 51, the second circuit board 52 and the second connector portion 54 as above, similarly to Embodiment 1, the contact pressures between the first contact portions 14 of the first circuit board 51 and the corresponding second contact portions 24 of the second circuit board 52 are prevented from varying, so that each combination of the first contact portion 14 and the second contact portion 24 can have stable electrical connection, while the circuit board assembly that is extremely thin in the Z direction can be obtained.

Embodiment 3

In Embodiment 1 above, the fitting plate 42 of the second connector portion 41 has the partition portion 47 separating between the pair of spring piece insertion holes 46 constituting the fitting hole unit 44, and when the first connector portion 31 and the second connector portion 41 are fitted with each other, the first contact portion 14 of the first circuit board 11 and the second contact portion 24 of the second circuit board 21 are elastically pressed into contact with each other between the lateral surfaces of the spring pieces 36 of the projection unit 34 of the first connector portion 31 and the opposite lateral surfaces of the partition portion 47 in the fitting hole unit 44; however, the invention is not limited thereto.

Figure 25:
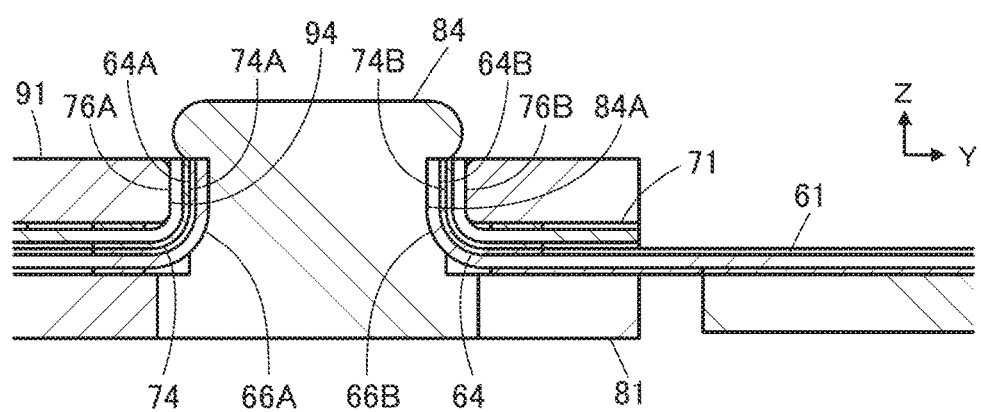
FIG. 25 is a partial cross-sectional view showing the fitting state between a projection unit of a first connector portion and a fitting hole unit of a second connector portion in a circuit board assembly according to Embodiment 3.

FIG. 25 shows the fitting state between a projection unit 84 of a first connector portion 81 and a fitting hole unit 94 of a second connector portion 91 in a circuit board assembly according to Embodiment 3. The projection unit 84 of the first connector portion 81 has, for instance, the shape of a substantially quadrangular prism projecting in the +Z direction, is made of an insulating material such as insulating rubber, and has elasticity at least in the Y direction. The fitting hole unit 94 of the second connector portion 91 is a through-hole having a substantially rectangular plane shape corresponding to the projection unit 84 of the first connector portion 81.

A first circuit board 61 has a first contact portion 64 composed of pairs of conductive first contacts 64A and 64B separately formed on surfaces of a pair of first projection pieces 66A and 66B disposed to abut against each other in the Y direction, and similarly, a second circuit board 71 has a second contact portion 74 composed of pairs of conductive second contacts 74A and 74B formed on surfaces of a pair of second projection pieces 76A and 76B disposed to abut against each other in the Y direction.

When the first connector portion 81 and the second connector portion 91 are fitted with each other, the projection unit 84 of the first connector portion 81 is fitted into the fitting hole unit 94 of the second connector portion 91 as catching the first contact portion 64 of the first circuit board 61 and the second contact portion 74 of the second circuit board 71 with the first and second contact portions 64 and 74 being overlapped to face each other, and, separately and correspondingly, the pairs of first contacts 64A and 64B formed on the pair of first projection pieces 66A and 66B of the first circuit board 61 and the pairs of second contacts 74A and 74B formed on the pair of second projection pieces 76A and 76B of the second circuit board 71 are sandwiched by the lateral surface 84A of the projection unit 84 of the first connector portion 81 and the inner surface of the fitting hole unit 94 of the second connector portion 91.

Since the projection unit 84 of the first connector portion 81 has elasticity in the Y direction, the pairs of first contacts 64A and 64B of the first circuit board 61 and the pairs of second contacts 74A and 74B of the second circuit board 71 are elastically pressed into contact with each other between the lateral surface 84A of the projection unit 84 and the inner surface of the fitting hole unit 94 and thereby electrically connected to each other in a reliable manner.

Even with the use of the projection unit 84 of the first connector portion 81 and the fitting hole unit 94 of the second connector portion 91 as above, the first circuit board 61 and the second circuit board 71 can be electrically connected to each other in a stable manner as with Embodiment 1.

Figure 26:
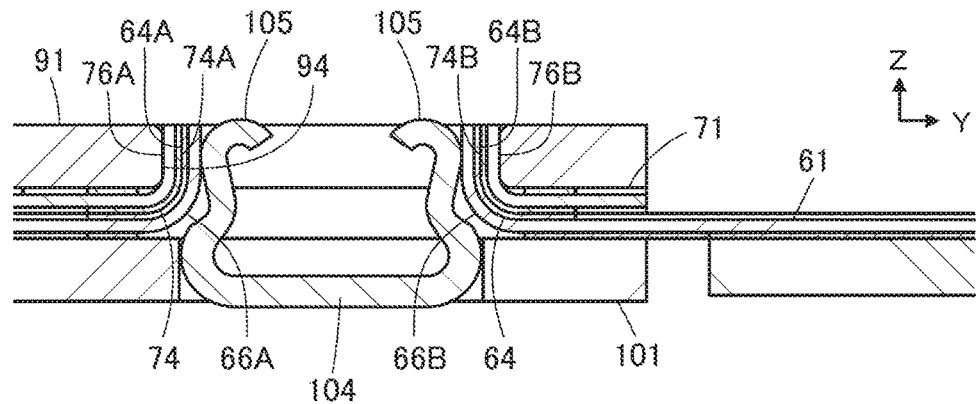
FIG. 26 is a partial cross-sectional view showing the fitting state between a projection unit of a first connector portion and the fitting hole unit of the second connector portion in a circuit board assembly according to a modification of Embodiment 3.
Figure 27:
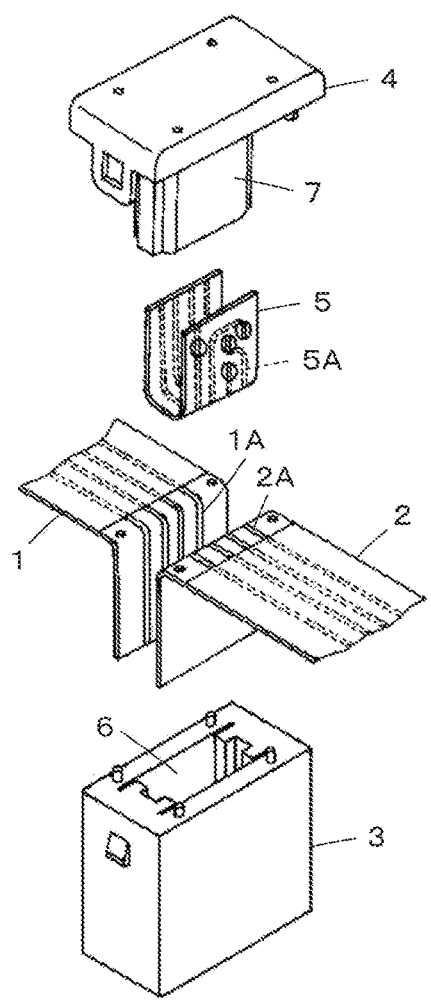
FIG. 27 is an exploded perspective view showing a conventional connector.

Even when the first connector portion 81 is replaced by a first connector portion 101 having a projection unit 104 constituted of a metal spring as shown in FIG. 26, the first circuit board 61 and the second circuit board 71 can be electrically connected to each other.

The projection unit 104 has a pair of spring pieces 105 facing each other in the Y direction and having elasticity in the Y direction, and, separately and correspondingly, the pairs of first contacts 64A and 64B formed on the pair of first projection pieces 66A and 66B of the first circuit board 61 and the pairs of second contacts 74A and 74B formed on the pair of second projection pieces 76A and 76B of the second circuit board 71 are sandwiched between lateral surfaces of the pair of spring pieces 105 of the first connector portion 101 and the inner surface of the fitting hole unit 94 of the second connector portion 91, thereby elastically pressed into contact with each other, and electrically connected to each other in a reliable manner.

What is claimed is:

1. A connector for connecting a first circuit board having two or more first contact portions that are bendable and a second circuit board having two or more second contact portions that are bendable, the connector comprising:
   a first connector portion in which two or more projection units project from a surface of a base plate; and
   a second connector portion constituted of a fitting plate in which two or more fitting hole units 80 corresponding to the two or more projection units are formed,
   wherein the first connector portion has at least one locking portion that is elastically deformable and is situated between one pair of adjacent projection units of the two or more projection units,
   wherein the second connector portion has at least one portion to be locked corresponding to the at least one locking portion of the first connector portion,
   wherein at least one of the two or more projection units and the two or more fitting hole units have elasticity, and
   wherein when the first connector portion and the second connector portion are fitted with each other, each of the two or more projection units of the first connector portion is fitted into a corresponding one of the two or more fitting hole units of the second connector portion as catching each of the two or more first contact portions of the first circuit board and a corresponding one of the two or more second contact portions of the second circuit board that are overlapped to face each other, and the each of the two or more first contact portions of the first circuit board and the corresponding one of the two or more second contact portions of the second circuit board are elastically pressed into contact with each other and thus electrically connected to each other between a lateral surface of the each of the two or more projection units and an inner surface of the corresponding one of the two or more fitting hole units, while each of the at least one locking portion is caught on a corresponding portion to be locked whereby a fitting state between the first connector portion and the second connector portion is locked.

2. The connector according to claim 1,
   wherein the two or more projection units are arranged in an arrangement direction, each of the at least one locking portion being situated between two adjacent projection units, and
   wherein the two or more fitting hole units are arranged in the arrangement direction, each of the at least one portion to be locked being situated between two adjacent fitting hole units.

3. The connector according to claim 2,
   wherein the two or more projection units are arranged in two rows, each of the two or more projection units being adjacent to a corresponding locking portion across the two rows in a direction perpendicular to the arrangement direction, and
   wherein the two or more fitting hole units are arranged in two rows, each of the two or more fitting hole units being adjacent to a corresponding portion to be locked across the two rows in the direction perpendicular to the arrangement direction.

4. The connector according to claim 2,
   wherein the two or more projection units are arranged in two rows, each of the two or more projection units being adjacent to another one of the two or more projection units across the two rows in a direction perpendicular to the arrangement direction, and
   wherein the two or more fitting hole units are arranged in two rows, each of the two or more fitting hole units being adjacent to another one of the two or more fitting hole units across the two rows in the direction perpendicular to the arrangement direction.

5. The connector according to claim 2,
   wherein each of the two or more projection units is made of a metal spring and held in the base plate so as to be elastically deformable in a direction perpendicular to the arrangement direction.

6. The connector according to claim 5,
wherein each of the two or more projection units has a pair of spring pieces facing each other,
wherein each of the two or more fitting hole units has a pair of spring piece insertion holes that receive therein the pair of spring pieces separately,
wherein the fitting plate has a partition portion separating between the pair of spring piece insertion holes, and
wherein the inner surface of each of the two or more fitting hole units is formed of opposite lateral surfaces of the partition portion.

7. The connector according to claim 6,
wherein a shortest distance between end portions of the pair of spring pieces when the first connector portion and the second connector portion are not fitted with each other is smaller than a value obtained by adding a value twice a thickness of the first circuit board and a value twice a thickness of the second circuit board to a length of the partition portion between the pair of spring piece insertion holes.

8. The connector according to claim 2,
wherein at least a surface portion of the two or more projection units is made of insulating rubber.

9. The connector according to claim 2,
wherein each of the at least one locking portion has a pair of locking pieces that are elastically deformable and face each other,
wherein the fitting plate has a pair of locking piece insertion holes that are separately situated on opposite sides of each of the at least one portion to be locked and receive therein the pair of locking pieces separately, and
wherein each of the at least one portion to be locked has a pair of step portions that catch ends of the pair of locking pieces.

10. The connector according to claim 1, including a positioning mechanism for positioning the first circuit board, the second circuit board and the second connector portion with respect to each other.

11. A circuit board assembly, comprising:
a first circuit board having two or more first contact portions that are bendable;
a second circuit board having two or more second contact portions that are bendable; and
the connector according to claim 1,
wherein each of the two or more projection units of the first connector portion is fitted into a corresponding one of the two or more fitting hole units of the second connector portion as catching each of the two or more first contact portions of the first circuit board and a corresponding one of the two or more second contact portions of the second circuit board that are overlapped to face each other, and the each of the two or more first contact portions of the first circuit board and the corresponding one of the two or more second contact portions of the second circuit board are elastically pressed into contact with each other and thus electrically connected to each other between the lateral surface of the each of the two or more projection units and the inner surface of the corresponding one of the two or more fitting hole units, and
wherein each of the at least one locking portion is caught on a corresponding portion to be locked whereby a fitting state between the first connector portion and the second connector portion is locked.

12. The circuit board assembly according to claim 11,
wherein a plurality of first contact portions of the two or more first contact portions of the first circuit board and a plurality of second contact portions of the two or more second contact portions of the second circuit board are overlapped correspondingly and inserted together with each of the two or more projection units into a corresponding one of the two or more fitting hole units of the second connector portion to be thereby electrically connected to each other.

13. The circuit board assembly according to claim 11,
wherein each of the first circuit board and the second circuit board is constituted of a flexible insulation substrate that has conductive layers formed thereon, the two or more first contact portions being connected to the conductive layers of the first circuit board, the two or more second contact portions being connected to the conductive layers of the second circuit board.

14. A connection structure in which a first circuit board having a first contact portion that is bendable and a second circuit board having a second contact portion that is bendable are connected to each other, the structure comprising:
a first connector portion in which a pair of spring pieces facing each other are formed on a surface of a base plate; and
a second connector portion constituted of a fitting plate, the fitting plate having a pair of spring piece insertion holes that receive therein the pair of spring pieces separately and a partition portion that separates between the pair of spring piece insertion holes,
wherein the pair of spring pieces of the first connector portion are fitted into the pair of spring piece insertion holes of the second connector portion as catching the first contact portion of the first circuit board and the second contact portion of the second circuit board that are overlapped to face each other, and the first contact portion of the first circuit board and the second contact portion of the second circuit board are elastically pressed into contact with each other and thus electrically connected to each other between lateral surfaces of the pair of spring pieces and opposite lateral surfaces of the partition portion.

* * * * *

UNITED STATES PATENT AND TRADEMARK OFFICE
CERTIFICATE OF CORRECTION

PATENT NO.       : 10,797,418 B2
APPLICATION NO.  : 16/675812
DATED            : October 6, 2020
INVENTOR(S)      : Tetsuya Komoto Page 1 of 1

It is certified that error appears in the above-identified patent and that said Letters Patent is hereby corrected as shown below:

On the Title Page

Column 2, Line 1:
In (56) References Cited, "Landi" should be changed to --Landi et al.--.

In the Claims

Column 15, Line 66, "units 80" should be changed to --units--.

Signed and Sealed this
Tenth Day of August, 2021

Drew Hirshfeld
*Performing the Functions and Duties of the*
*Under Secretary of Commerce for Intellectual Property and*
*Director of the United States Patent and Trademark Office*